(12) United States Patent
Yoneya et al.

(10) Patent No.: US 6,490,219 B2
(45) Date of Patent: Dec. 3, 2002

(54) SEMICONDUCTOR INTEGRATED CIRCUIT DEVICE AND METHOD OF MANUFACTURING THEREOF

(75) Inventors: Kazuhide Yoneya, Sagamihara (JP); Masaru Koyanagi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/971,371

(22) Filed: Oct. 3, 2001

(65) Prior Publication Data

US 2002/0051400 A1 May 2, 2002

(30) Foreign Application Priority Data

Oct. 4, 2000 (JP) ........................................ 2000-305402

(51) Int. Cl.[7] ................................................ G11C 7/00
(52) U.S. Cl. ...................................... 365/225.7; 365/96
(58) Field of Search ............................... 365/225.7, 96, 365/189.01, 189.12, 240; 327/525; 323/354

(56) References Cited

U.S. PATENT DOCUMENTS

| 5,461,584 | A | * | 10/1995 | Ikuta et al. .................. 327/509 |
| 5,682,346 | A | * | 10/1997 | Yamamura et al. ..... 365/185.18 |
| 6,307,801 | B1 | * | 10/2001 | Ogawa et al. ............... 365/226 |
| 6,373,771 | B1 | * | 4/2002 | Fifield et al. ........... 365/189.05 |

FOREIGN PATENT DOCUMENTS

JP          2000-163999          6/2000

* cited by examiner

*Primary Examiner*—Michael S. Lebentritt
*Assistant Examiner*—Anh Phung
(74) *Attorney, Agent, or Firm*—Hogan & Hartson, LLP

(57) ABSTRACT

A semiconductor integrated circuit device comprises an integrated circuit portion, a fuse element block, and a data transfer selecting circuit. The fuse element block includes a programmable fuse element. The data transfer selecting circuit selects one of the transfer of data programmed in the fuse element to the integrated circuit portion, transfer of data input from outside to the integrated circuit portion, and transfer of data programmed in the fuse element to outside.

9 Claims, 13 Drawing Sheets

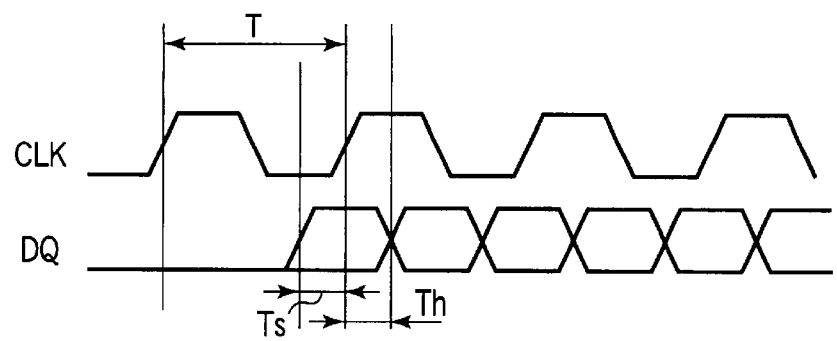
F I G. 2A
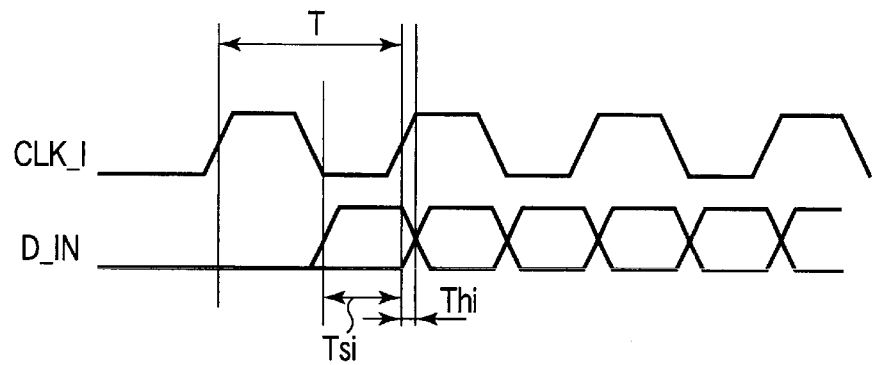
F I G. 2B
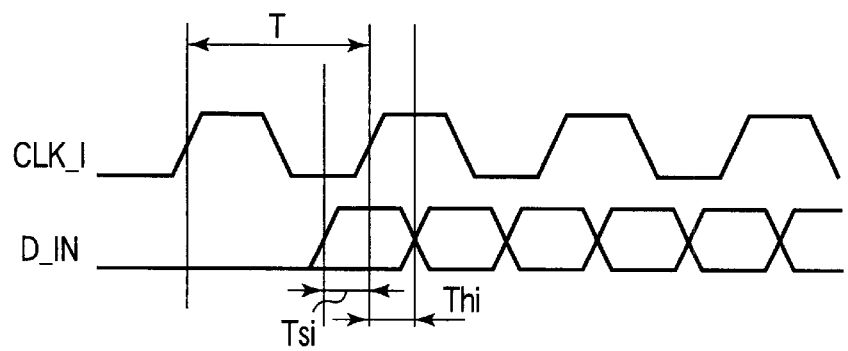
F I G. 2C

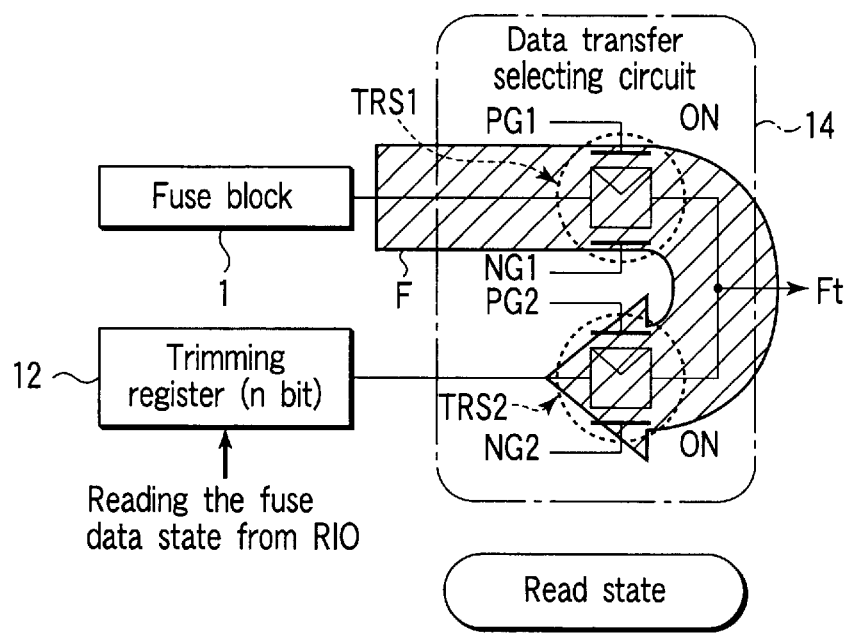
F I G. 7
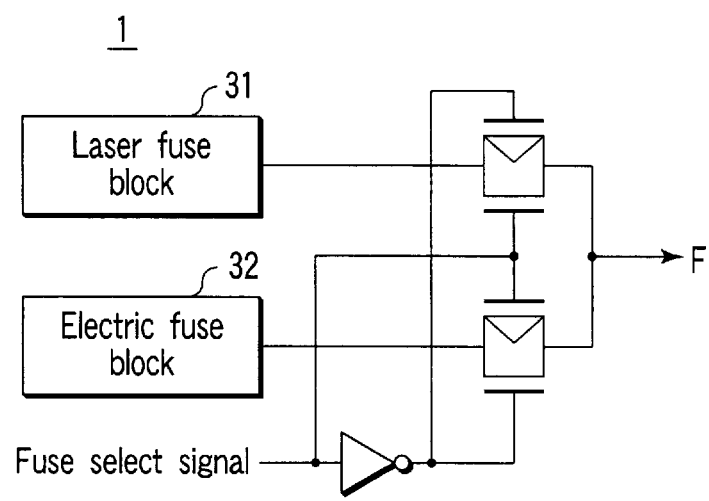
F I G. 8

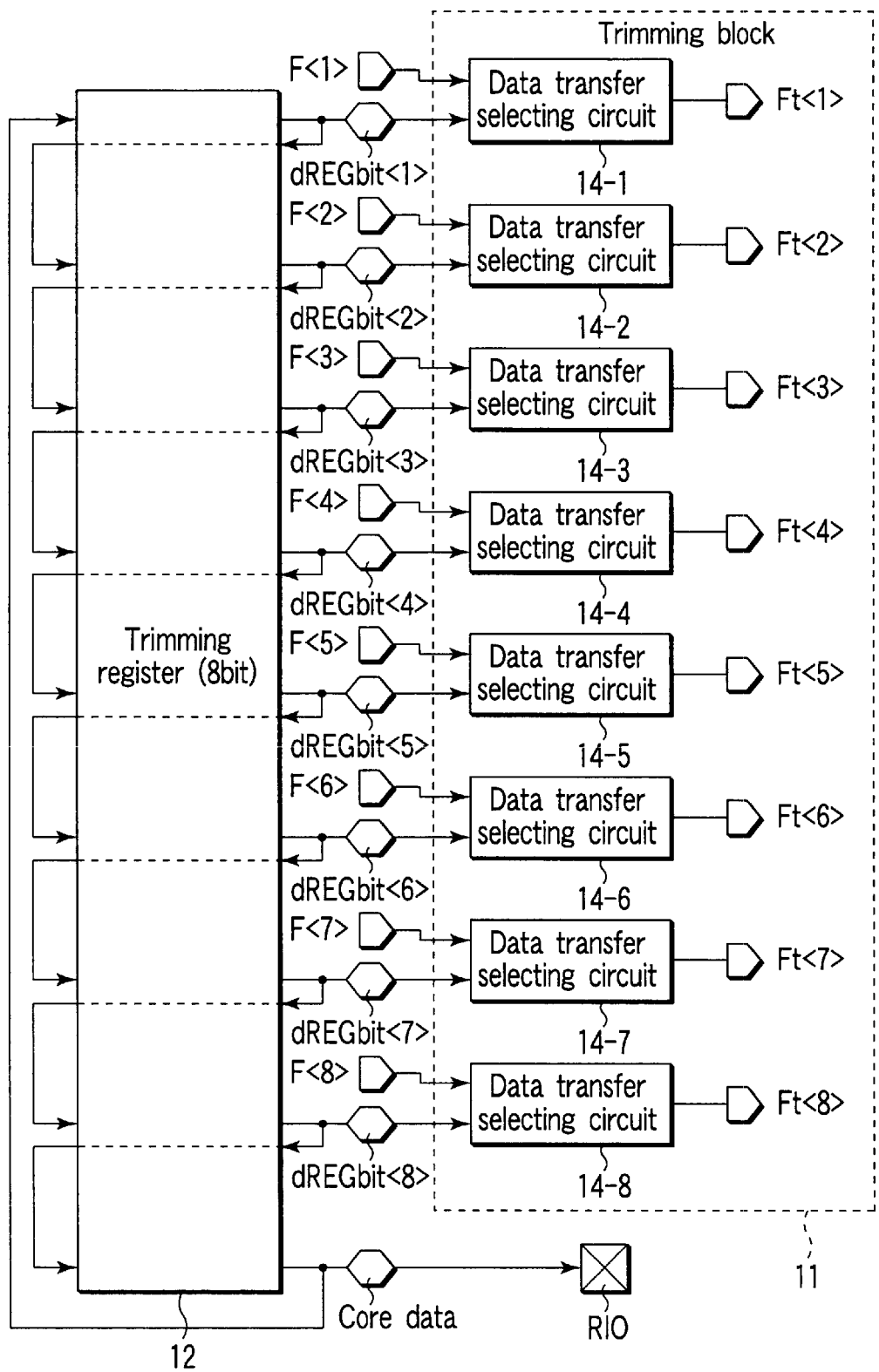
F I G. 9

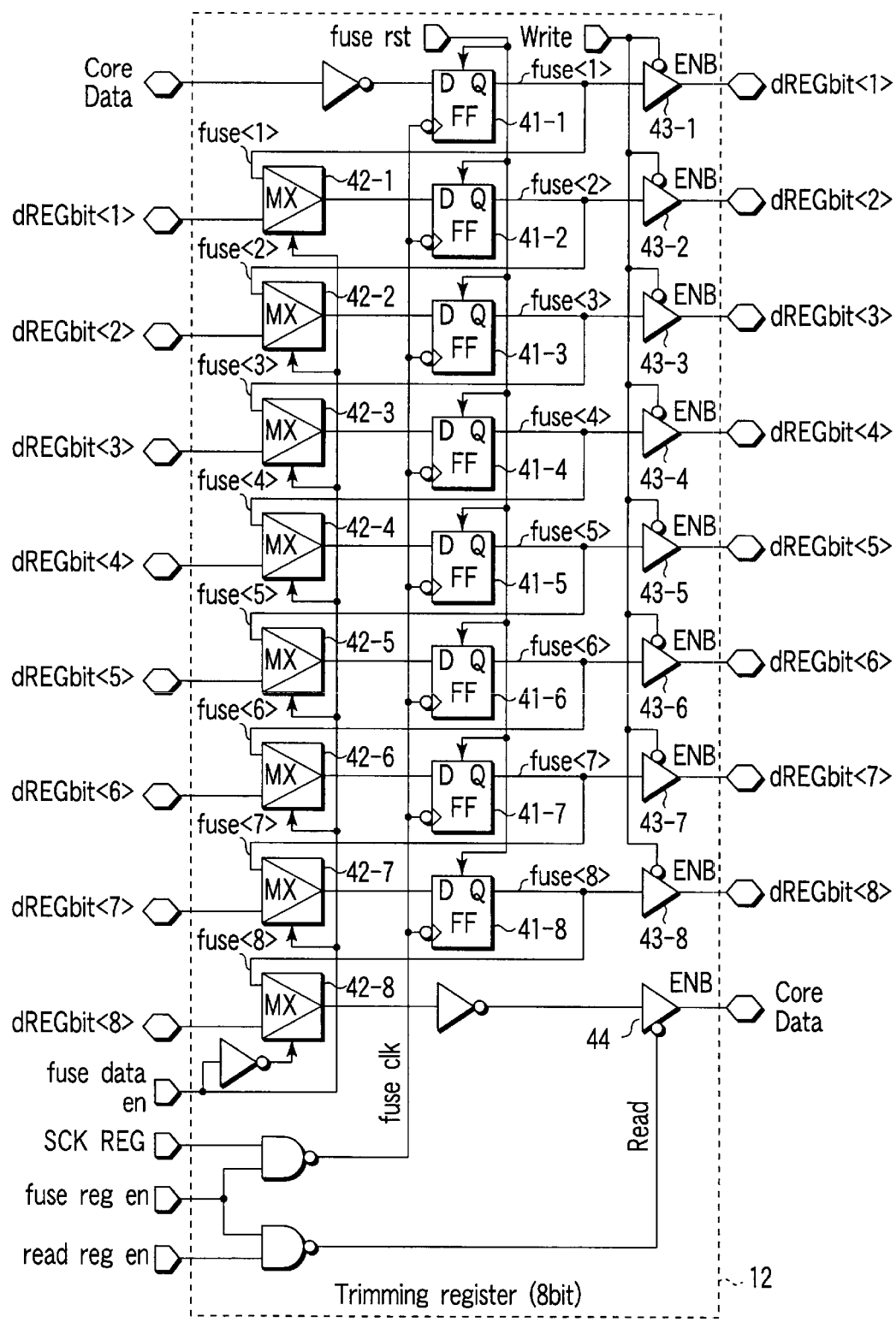
F I G. 10

SEMICONDUCTOR INTEGRATED CIRCUIT DEVICE AND METHOD OF MANUFACTURING THEREOF

CROSS-REFERENCE TO RELATED APPLICATIONS

This application is based upon and claims the benefit of priority from the prior Japanese Patent Application No. 2000-305402, filed Oct. 4, 2000, the entire contents of which are incorporated herein by reference.

BACKGROUND OF THE INVENTION

1. Field of the Invention

The present invention relates to a semiconductor integrated circuit device, more specifically, the invention relates to a semiconductor memory device capable of trimming of chip internal timing by fuse blow and redundancy replacement.

2. Description of the Related Art

In recent year, along with the ultra fine level of semiconductor manufacturing processes and the high speed of semiconductor memory devices to meet the high speed of system clocks, action margin in circuits has become small and it has been very difficult to optimize circuit actions.

Further, process fluctuations owing to complicated manufacturing processes have caused characteristics of transistor and resister to go out of the initial design targets, which in turn has made it more difficult to optimize circuit actions.

For the purpose of the optimization of circuit actions and the improvement of yield, in ordinary cases, in consideration of the influences by these process fluctuations and the like, a fuse set for trimming circuit characteristics and a fuse set for replacing redundancy of queue addresses are arranged in a chip.

With respect to fuses, a laser fuse wherein a fuse of polysilicon, metal and the like is blown by a laser beam is generally employed, while with a laser fuse, it is not possible to trim a chip after packaging, as a result, in recent years, an electric fuse wherein a fuse can be blown electrically even after packaging has come to be employed in chips.

FIG. 15 is a block diagram showing a typical constitution of such semiconductor memory device described above.

AS shown in FIG. 15, a semiconductor memory device includes the number n of fuses in total, and comprises a fuse set block (Fuse Block) 1 that outputs fuse data F<n> for trimming circuit characteristics, a clock generating circuit (Control Clock Generator) 2 that can trim the generation timing of an internal clocks CLK_P/CLK_O/CLK_I to control actions of chip inside, a peripheral circuit 3 that is controlled by the internal clocks CLK_P/CLK_O/CLK_I generated from the clock generating circuit 2, an I/O circuit 4 consisting of 2 circuits, i.e., a data output buffer (Data Out Buffer) and a data input buffer (Data In Buffer), and a memory cell array 5 in which data read and write are controlled by the circuits 3 and 4 controlled by the internal clocks.

In the device shown in FIG. 15, the internal clocks CLK_P/CLK_O/CLK_I generated from the clock generating circuit 2 are internal clocks for controlling the peripheral circuit 3, the data output buffer in the I/O circuit 4, and the data input buffer respectively.

The peripheral circuit 3 works in synchronization with the internal clock CLK_P, therefore, by changing the generating timing of the clock CLK_P, the action timing in the peripheral circuit 3 may be changed optionally.

The data output buffer is a circuit for reading data from the memory cell array to the outside of the chip in synchronization with a rise edge or a fall edge, or both the edges of the internal clock CLK_O, and by changing the generating timing of the clock CLK_O, it is possible to adjust the timing of data output in optional manners.

While, the data input buffer is a circuit for take data to be written into the memory cell array into the inside of the chip in synchronization with the rise edge, or the fall edge, or both the edges of the internal clock CLK_I, and by changing the generating timing of the clock CLK_I, it is possible to adjust the timing of data input in optional manners.

In the next place, the whole actions will be explained with the case of trimming of data input timing as an example.

FIG. 16A is a diagram showing a relation between an external clock CLK and data DQ, FIG. 16B is a diagram showing a relation between an internal clock CLK_I and an input data D_IN (before trimming), and FIG. 16C is a diagram showing a relation between an internal clock CLK_I and an input data D_IN (after trimming).

As shown in FIG. 16A, the write data to the memory cell array is input from DQ PAD in synchronization with both the rise edge and the fall edge of the external clock CLK. At this moment, data is input at the timing at which the circuit action margin of the data input buffer becomes maximum to the clock. Namely, when a clock cycle is referred to as T, data is input at the timing at which a set up time Ts of certain input data to the clock and a hold time Th should become T/4.

In this way, the relation between the clock and the data is optimized at the outside of the chip, however in the actual inside of the chip, such an ideal relation is in fact not attained. This is because there is delay in the generating timing of the internal clock CLK_I owing to process fluctuations, and under the influences of LCR inside of the chip.

Now, it is assumed that the timing of the internal clock CLK_I is displaced by +Δt from the factors mentioned above. In this case, as shown in FIG. 16B, a setup time Tsi of data input to the chip internal data D_IN becomes T/4 +Δt, and the circuit action margin widens, while a hold time Thi of the data input becomes T/4−Δt, and the circuit action margin become small, different from the former case.

In order to correct such imbalance of the circuit action margin, a fuse that fastens the generating timing of the internal clock CLK_I by −Δt is blown, thereby the internal clock CLK_I is trimmed, and as shown in FIG. 16C, the internal timing is coordinated with the external timing, and thereby the circuit actions are optimized.

However, since an actual chip is subject to the influence of process fluctuations, even when an identical fuse is blown, a trimming value is not always same, which is the fact at present.

Accordingly, a trimming method by the fuse blow mentioned above has held a problem that the trimming effect by fuse blow, i.e., whether the blown fuse is actually optimized to the chip concerned or not, can be known only after the fuse concerned is actually blown. As a consequence, trimming amount may be in short, or to excess in cases.

In other words, in the method for trimming by fuse blow in the prior art, it has been extremely difficult to carry out the optimized trimming to a chip, which has been a problem in the prior art.

In the method by laser fuse blow carried out before packaging, it is easily confirmed whether a fuse concerned is blown correctly or not, while when using the electric fuse after packaging a chip, there is no means for judging whether the fuse is blown correctly or not, therefore, it is not to be known until the chip is tested in actual manners, which has been another problem with the prior art.

The above is the case concerning the trimming of clock generating timing, but the conditions are same also in the cases of redundancy replacement of queue addresses.

In general, in the replacement of queue addresses by redundancy, before carrying out fuse blow, a test is carried out on a redundancy array to be determined by the queue address to be replaced, and on the basis of the result thereof, redundancy replacement is carried out.

The redundancy cell test is only for testing whether a cell is valid or not, therefore, the test is nor carried out by making a chip work at the same timing as an actual test.

Consequently, there may be cases where a test is made after redundancy replacement, action is not made correctly owing to mismatch in timing and the like.

The above inconvenience, as well as the case of the above clock generating timing, comes from the fact that by the current trimming method by fuse blow and the method of redundancy replacement, it is not possible to judge the conditions of a chip after fuse blow, until the fuse is actually blown, which has been still another problem in the prior art.

BRIEF SUMMARY OF THE INVENTION

A semiconductor integrated circuit device according to an embodiment of the present invention comprises: an integrated circuit portion; a fuse element block including a programmable fuse element; and a data transfer selecting circuit that selects any one of transfer of data programmed in the fuse element to the integrated circuit portion, transfer of data input from outside to the integrated circuit portion, and transfer of data programmed in the fuse element to outside.

BRIEF DESCRIPTION OF THE SEVERAL VIEWS OF THE DRAWING

FIG. 2A is a signal waveform diagram showing an example of a relation between an external clock CLK and data DQ.

FIG. 2B is a signal waveform diagram showing an example of a relation between an internal clock CLK_I and input data D_IN (before trimming).

FIG. 2C is a signal waveform diagram showing an example of a relation between an internal clock CLK_I and input data D_IN (after trimming).

FIG. 7 is a diagram showing an example of a condition of a data transfer circuit 14 in a Read state.

FIG. 8 is a circuit diagram showing a circuit example of a fuse set block 1.

FIG. 9 is a block diagram showing an example of a relation between a trimming register 12 and a trimming block 11.

FIG. 10 is a circuit diagram showing a circuit example of the trimming register 12.

DETAILED DESCRIPTION OF THE INVENTION

Figure 1:
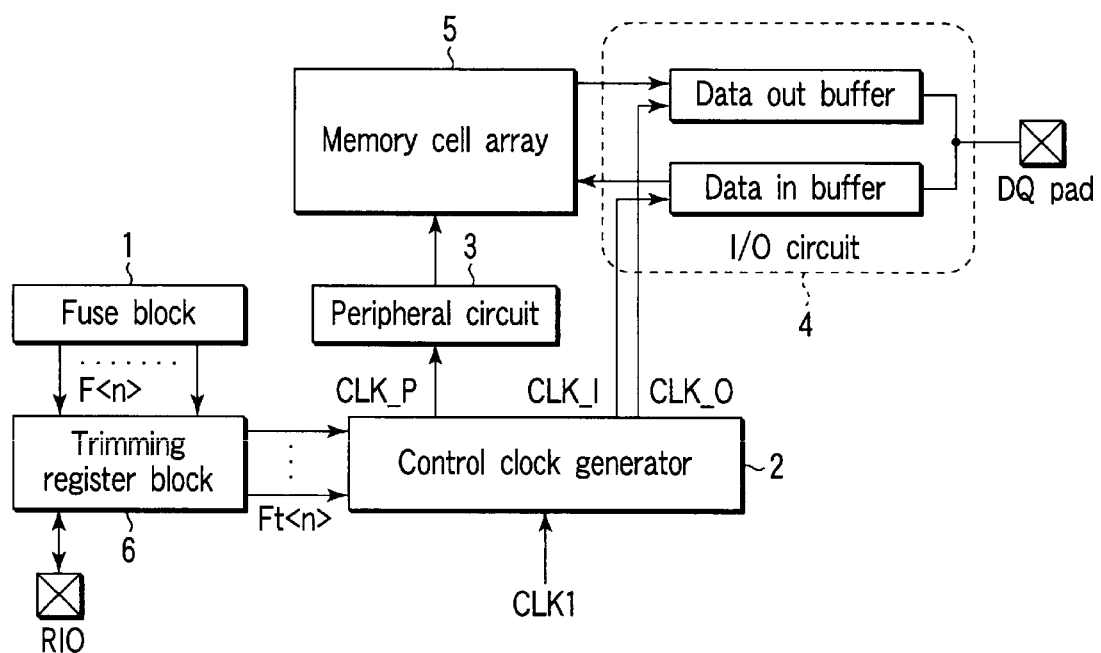
FIG. 1 is a block diagram showing a configuration example of a semiconductor integrated circuit device according to a first embodiment of the present invention.

Hereinafter, embodiments of the present invention will be explained with reference to the accompanying drawings. In the explanation, like parts in each of the several figures are identified by the same reference numerals.

First Embodiment

FIG. 1 is a block diagram showing a constitution of a semiconductor integrated circuit device according to a first embodiment of the present invention.

As shown in FIG. 1, a fuse set block (Fuse Block) 1 includes the number n in total of fuses to be blown by laser, or electric means such as electric current and the like, and outputs a parallel fuse data F<1:n> that shows whether the fuses are blown or not. The parallel fuse data F<1:n> is used as data for trimming circuit characteristics.

A clock generating circuit (Control Clock Generator) 2 receives an external clock signal CLK1, and generates a plurality of internal clock signals CLK_P/CLK_O/CLK_I that controls actions inside of a chip. The clock generating circuit 2 trims the generating timing of the above internal clocks CLK_P/CLK_O/CLK_I into the optimized value on the basis of the above fuse data F<1:n>.

A peripheral circuit 3, whose actions are controlled by the internal clock signal CLK_P generated by the clock generating circuit 2, takes in an external command signal in synchronization with the internal clock signal CLK_P, and carries out calculations, and generates a plurality of address signals of queue and a plurality of internal control signals.

An I/O circuit 4 includes: a data input buffer (Data In Buffer) that, in synchronization with the internal clock signal CLK_I generated by the clock generating circuit 2, takes in an external serial data signal having a data width of, for example, q bits and transfers the external serial data signal to an internal serial data signal line having a data width of q bits; and a data output buffer (Data Out Buffer) that, in synchronization with the internal clock signal CLK_O generated by the clock generating circuit 2, takes in an internal serial data signal having a data width of, for example, q bits and transfers the internal serial data signal to an external serial data signal line having a data width of q bits.

A memory cell array 5 comprises a plurality of memory cells selected by a plurality of address signals. Reading data from and writing data into the memory cell array 5 is controlled by the peripheral circuit 3 and the I/O circuit 4.

Further, the device according to the present embodiment includes a trimming register circuit (Trimming Register Block) 6 that outputs a trimming data signal Ft<n> that trims the generating timing of the internal clock signals CLK_P/CLK_O/CLK_I generated by the clock generating circuit 2.

The trimming register circuit 6 converts and outputs any one of the parallel fuse data F<1:n> output from the fuse set block 1 and a data-rewritable and parallel data R<1:n> transferred from a trimming register (whose detailed described hereinafter) arranged in the trimming register circuit 6 as a trimming data Ft<1:n>.

In the device shown in FIG. 1, the internal clocks CLK_P/CLK_O/CLK_I generated from the clock generating circuit 2 are internal clocks for controlling the peripheral circuit 3, the data output buffer in the I/O circuit 4, and the data input buffer respectively.

In the device according to the present embodiment, as shown in FIGS. 2A to 2C, as same as in the prior art, by changing the internal clock generating timing, it is possible to adjust the action timing in the peripheral circuit 3, the data input timing, and the data output timing to the optimized values.

Hereafter the trimming register circuit 6 in the present embodiment will be explained.

Figure 3:
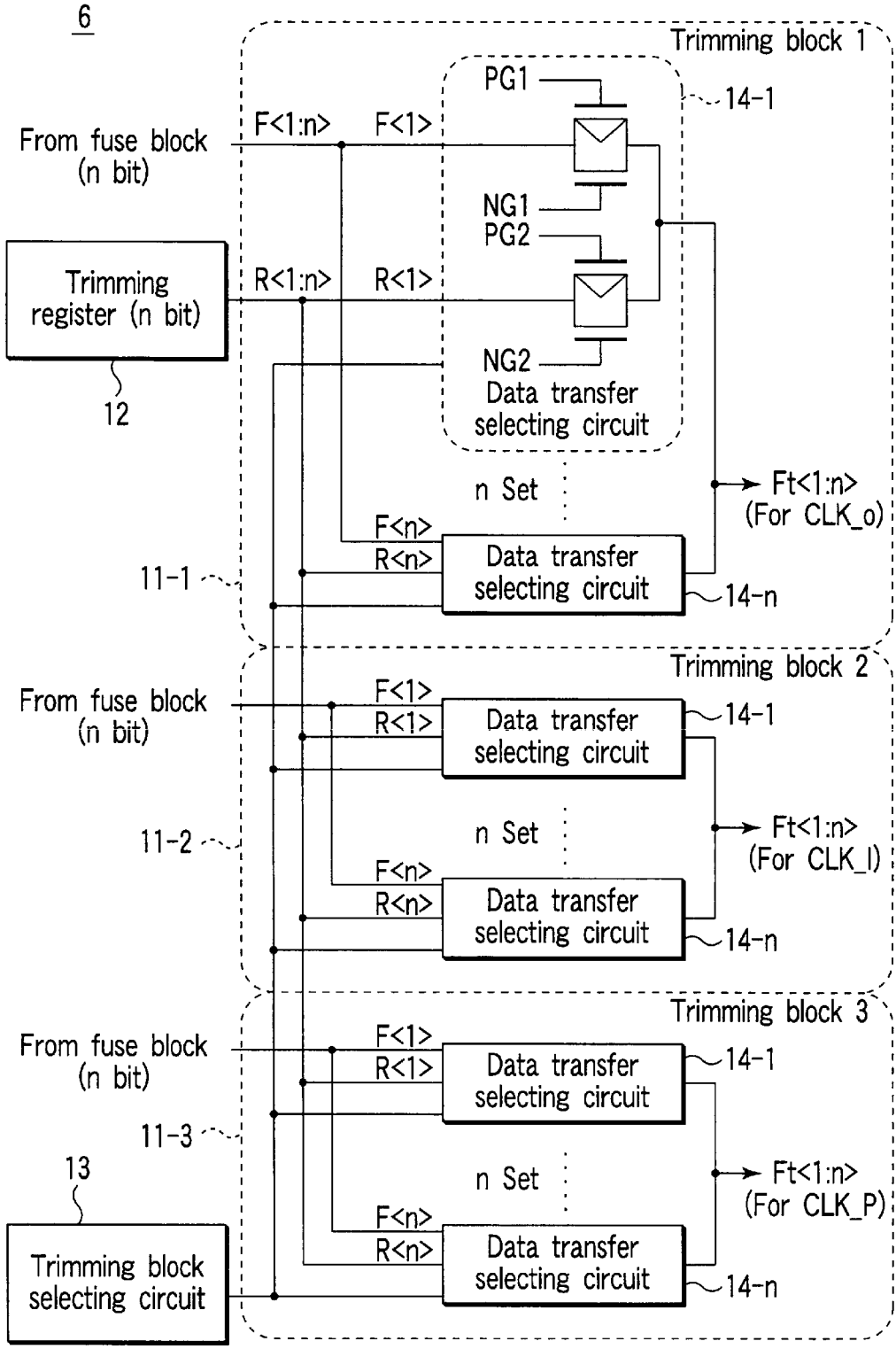
FIG. 3 is a circuit diagram showing a circuit example of a trimming register circuit 6.

FIG. 3 is a circuit diagram showing a circuit constitution example of the trimming register circuit 6 according to the present invention.

As shown in FIG. 3, the trimming register circuit 6 in the present embodiment comprises three circuits, i.e., trimming blocks (Trimming Block 1 to Trimming Block 3) 11-1 to 11-3, a trimming register (Trimming Register) 12 that can freely read and write data of n bits, and a trimming block (Trimming Block) selecting circuit 13.

The trimming blocks (Trimming Block) 11-1 to 11-3 are divided for CLK_O, for CLK_I, and for CLK_P, and each of them comprises the number n of data (Data) transfer selecting circuits 14-1 to 14-n same as the number of bits necessary for trimming the internal clocks CLK_O/CLK_P/CLK_I.

Each of the number n of the data transfer selecting circuits 14-1 to 14-n that output the trimming data Ft<1:n> of n bits comprises two transfer gates, and controls outputting either the data F<1:n> from the fuse set or the data R<1:n> from the trimming register 12 as trimming data Ft<1:n>.

The control over a gate level of transfer gates in the data transfer selecting circuits 14-1 to 14-n, and the selection of the trimming blocks 11-1 to 11-3 are made by four control signals PG1/NG1/PG2/NG2 output from the trimming block selecting circuit 13.

The trimming register 12 is a read and write register of bit of the same number as the number of bits necessary for trimming the internal clocks CLK_O/CLK_P/CLK_I.

The trimming block selecting circuit 13 creates control signals PG1/NG1/PG2/NG2 for selecting the trimming blocks 11-1 to 11-3 corresponding to the internal clock that carries out trimming.

The trimming blocks 11-1 to 11-3 are divided into three states, i.e., (1) Normal state, (2) Write state, and (3) Read state according to the conditions of the above four control signals PG1/NG1/PG2/NG2.

In the next place, the trimming block selecting circuit 13 will be explained.

Figures 4A, 4B:
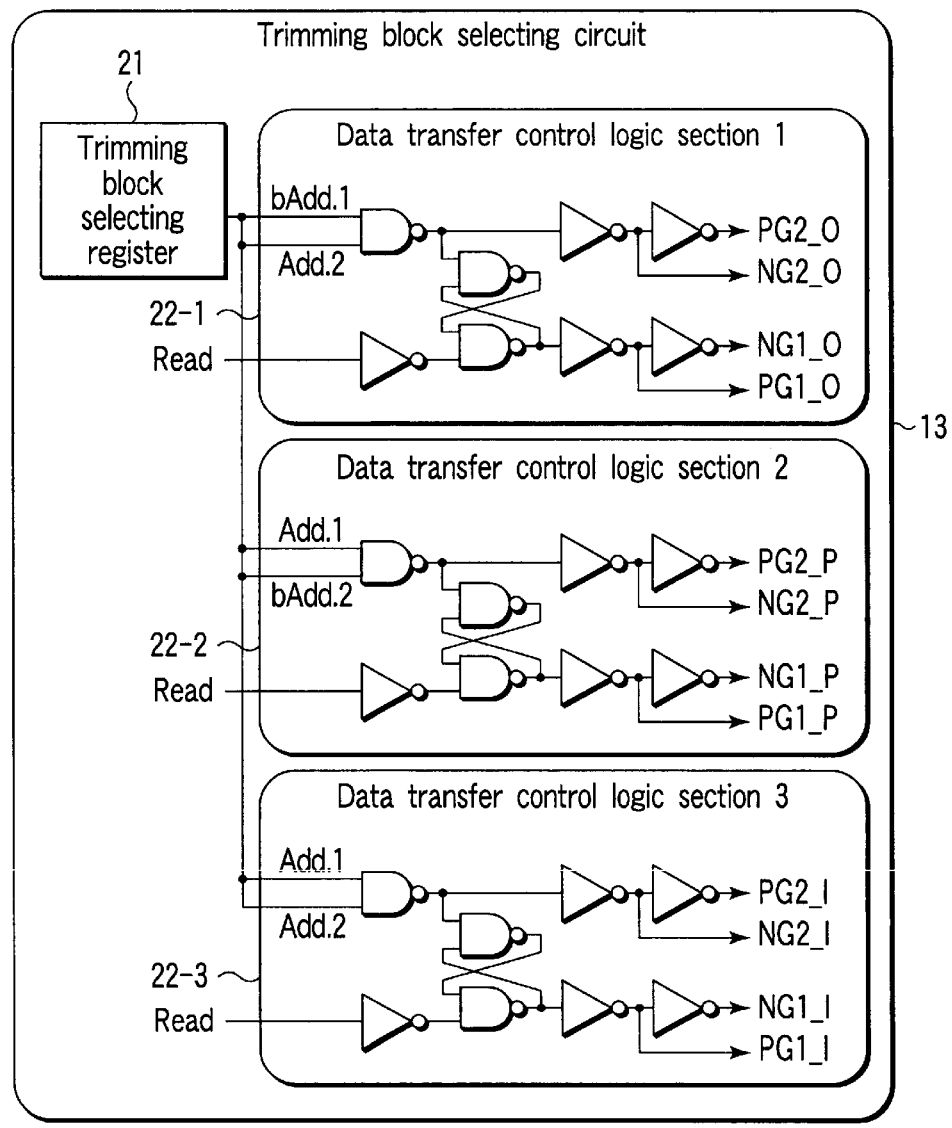
FIG. 4A is a circuit diagram showing a circuit example of a trimming block selecting circuit 13.
FIG. 4B is a table showing an example of the results of calculations of a data transfer control logic section.

FIG. 4A is a diagram showing an example a circuit constitution of a trimming block selecting circuit 13 according to the present embodiment.

As shown in FIG. 4A, the trimming block selecting circuit 13 in the present embodiment comprises a trimming block selecting register (Trimming Block Selecting Register) 21, and data transfer control logic sections (Data Transfer Control Logic section 1 to Data Transfer Control Logic section 3) 22-1 to 22-3.

The data transfer control logic sections 22-1 to 22-3 are divided into three corresponding to the above trimming blocks 11-1 to 11-3. The conditions of the data transfer control logic sections 22-1 to 22-3 are determined by address signals (Add1/Add2) of 2 bits output from the trimming block selecting register 21, and a mode signal Read that determines the conditions of the trimming blocks.

FIG. 4B shows an example of the results of calculations of the data transfer control logic section 22-3 to the trimming block 11-2 for the internal clock CLK_I.

As shown in FIG. 4B, when both the addresses Add1/Add2 from the trimming block selecting register 21 are not "HIGH", the trimming block 11-2 gets always in the Normal state. On the contrary, when both the addresses Add1/Add2 are "HIGH", the trimming block 11-2 gets in Read state if the mode signal Read is "HIGH", while in Write state if the mode signal Read is "LOW".

It is determined which of the trimming blocks 11-1 to 11-3 is selected according to the conditions of the addresses Add1/Add2 input into a NAND logic circuit in the data transfer control logic sections 22-1 to 22-3.

Hereafter there will be explained the three states of the trimming block 11, i.e., (1) Normal state, (2) Write state, and (3) Read state.

Figure 5:
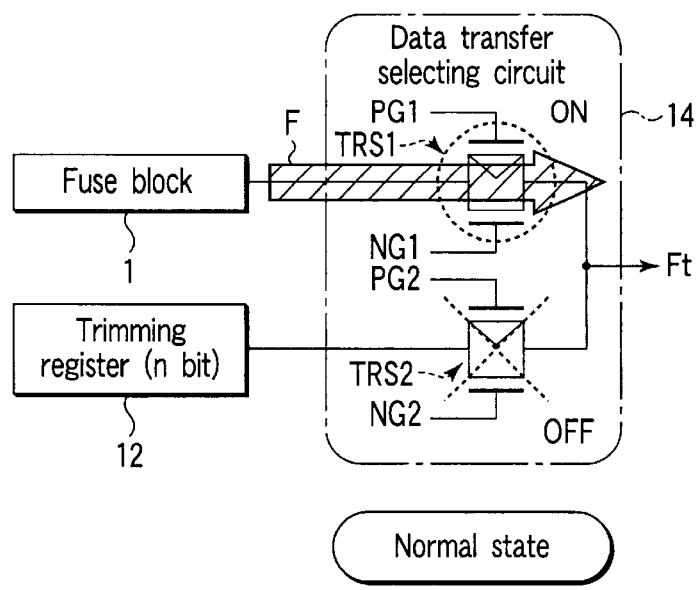
FIG. 5 is a diagram showing an example of a condition of a data transfer circuit 14 in a Normal state.

First (1) Normal state will be explained. FIG. 5 shows a condition of the data transfer circuit 14 in the Normal state.

In the (1) Normal state, as shown in FIG. 5, a transfer gate TRS1 is in an ON state, while a transfer gate TRS2 is in an OFF state. For this reason, trimming data Ft output to the clock generating circuit 2 becomes data F from the fuse set block 1, and the trimming of the internal clocks is made on the basis of the data F.

Figure 6:
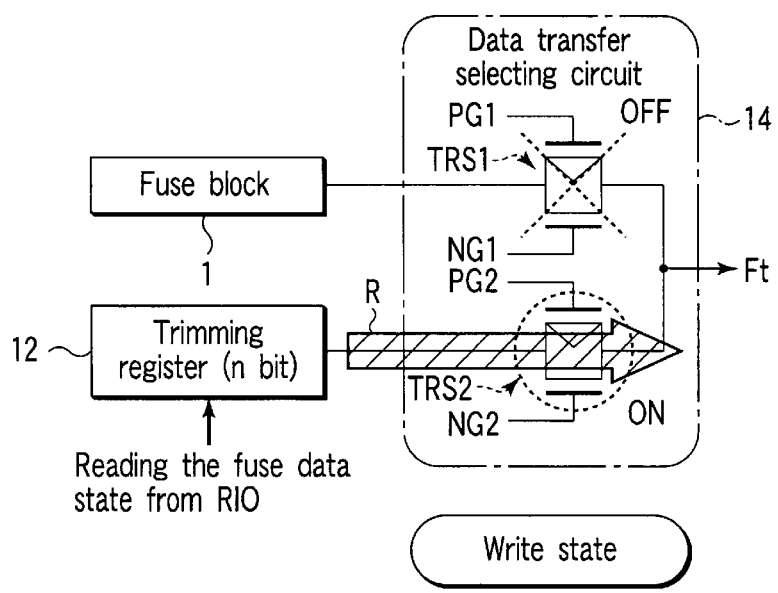
FIG. 6 is a diagram showing an example of a condition of a data transfer circuit 14 in a Write state.

Next, the (2) Write state will be explained hereafter. FIG. 6 shows a condition of the data transfer selecting circuit 14 in the trimming clock 11 in the Write state.

In the (2) Write state, as shown in FIG. 6, the transfer gate TRS1 is in the OFF state, while the transfer gate TRS2 is in the ON state. For this reason, the trimming data Ft output to the clock generating circuit 2 becomes data R from the trimming register 12. The data R from the trimming register 12 may be set freely by writing data into the trimming register 2 from, for example, an external pad RIO. Therefore, it is possible to freely carry out the trimming of the internal clocks.

In the next place, the (3) Read state will be explained. FIG. 7 shows a condition of the data transfer circuit 14 in the trimming block 11 in the Read state.

In the (3) Read state, as shown in FIG. 7, both the transfer gates TRS1 and TRS2 are in ON state. As a result, the trimming data Ft output to the clock generating circuit 2 becomes data F from the fuse set block 1.

In this case, since the transfer gate TRS2 is also in the ON state, it is possible to read the data F from the fuse set block 1, namely, the trimming data Ft, by use of the trimming register 12 through, for example, the external pad RIO.

Then the fuse set block 1 will be explained.

FIG. 8 is a diagram showing an example of a circuit constitution of a fuse set block 1 according to the present embodiment.

As shown in FIG. 8, the fuse set of the present embodiment comprises a laser fuse block (Laser Fuse Block) 31, and an electric fuse block (Electric Fuse Block) 32. For example, a laser melt down type fuse is arranged on the laser fuse block 31, while for example, a electric current melt down type fuse is arranged on the electric fuse block 32.

By such a constitution mentioned above, after a chip is trimmed by a laser fuse before packaging, even if it is required to carry out re-trimming owing to influence by packaging, it is possible to carry out trimming.

Next, the trimming register 12 will be explained.

FIG. 9 is a diagram showing a relation between the trimming register 12 and the trimming block 11 in the present embodiment, while FIG. 10 is a diagram showing an example of a circuit constitution of the trimming register 12. By the way, in this circuit configuration example, it is supposed that trimming data Ft is of 8 bits.

As shown in FIG. 9 and FIG. 10, the trimming register 12 includes eight flip flop (FF) circuits 41-1 to 41-8, eight multiplex (MX) circuits 42-1 to 42-8, eight Write output circuits 43-1 to 43-8, and a Read output circuit 44.

Each output node fuse<1:n> of the flip flop circuits 41-1 to 41-8 in this configuration example of the circuit is connected to a first input of the multiplex circuits 42-1 to 42-8, and also connected to inputs of the Write output circuits 43-1 to 43-8.

Each output of the write output circuits 43-1 to 43-8 is connected to a connection node dREGbit<1:n> between the trimming register 12 and the trimming block. Further, the connection node dREGbit<1:n> is connected to a second input of the multiplex circuits 42-1 to 42-8.

The multiplex circuits 42-1 to 42-8 respectively select any one of the output node fuse<1:n> and the connection node dREGbit<1:n> on the basis of a signal fuse data en, and connect to the inputs of the flip flop circuits 41-2 to 41-8, and the input of the Read output circuit 44.

The output of the Read output circuit 44 is connected to a connection node Core Data between the trimming register 12 and the external pad RIO. Further, the connection node Core Data is connected to the input of the flip flop circuit 41-1 at the first stage, among the flip flop circuits 41-1 to 41-8.

In the next place, actions thereof will be explained.

At Write process, first, the flip flop circuits 41-1 to 41-8 are reset by use of a reset signal fuse rst.

Further, the signal fuse data en is set to, for example, "HIGH" so that the multiplex circuits 42-1 to 42-7 respectively select an output node fuse<1:7>. By the way, the multiplex circuit 42-8 at the final stage is controlled by a signal of phase opposite to that of the fuse data en, and at Write process, it does not select an output node fuse<8>.

In this state, data is input in serial manner to the input of the flip flop circuit 41-1 at the initial stage from the external pad RIO via the connection node Core Data. The flip flop circuits 41-1 to 41-8 respectively work in synchronization with a control clock fuse clk, and output the input data according to the fall or rise of the control clock fuse clk. For example, by toggling the control clock fuse clk eight times, data is set to the respective eight flip flop circuits 41-1 to 41-8. After data is set, the signal write is set, for example, "HIGH" level, and the Write output circuits 43-1 to 43-8 are enabled respectively. As a result, the data set to the flip flop circuits 41-1 to 41-8 is output as data R<1:n> to the trimming block 11. Thereby, from the trimming block 11, as mentioned above, the data R<1:n> is output as a trimming data Ft<1:n> to the clock generating circuit 2.

While, at Read process, the flip flop circuits 41-1 to 41-8 are reset by use of the reset signal fuse rst.

Further, the signal fuse data en is first set, for example, "LOW", so that the multiplex circuits 42-1 to 42-7 respectively select the connection node dREGbit<1:7>. By the way, the multiplex circuit 42-8 at the final stage is controlled by a signal of phase opposite to that of the fuse data en, and at this moment, it does not select a connection node dREGbit<8>.

In this state, the data F<1:7> from the fuse set block 1 is input to the inputs of the flip flop circuits 41-2 to 41-8 at the initial stage, from the trimming block 11, via the connection node dREGbit<1:7>.

Then, the signal fuse data en is set from "LOW" into "HIGH", and the multiplex circuits 42-1 to 42-7 are made to select the output node fuse<1:7> respectively. At the same time, the multiplex circuit 42-8 at the final stage is made to select the connection node dREGbit<8>. Thereby, the data F<8> from the fuse set block 1 is input to the Read output circuit 44. In this state, the signal Read is set, for example, "HIGH" level, and the Read output circuit 44 is enabled, thereby the data F<8> is output via the connection node Core Data to the external pad RIO.

Then, the signal fuse data en is set from "HIGH" into "LOW" once again, and the multiplex circuit 42-8 at the final stage is made to select the output node fuse<8>. Thereby, to the Read output circuit 44, the data F<7> from the fuse set block 1 set in the flip flop circuit 41-8 is input, and following the data F<8>, the data F<7> is output via the connection node Core Data from the external pad RIO.

Hereafter, the above actions are repeated until the data F<1> is output, and thereby, the data F<1:8> set in the fuse set block 1 can be read.

In the next place, the entire actions of the present embodiment are explained hereafter.

First the case of trimming of data input timing will be explained. As same as the prior art, when the internal clock CLCK_I is delayed by +Δt in the chip inside as shown in FIG. 2B, it is required to carry out trimming to fasten by Δt the generation timing of the internal clock CLK_I by the clock generating circuit.

When carrying out trimming, in the prior art, it has been not possible to check actual trimming amount and the like until a fuse is actually blown, while according to the present invention, before a fuse if actually blown, the state of the trimming block 11 of the trimming register circuit 6 is set to the Write state, and trimming data same as a trimming forecast value by fuse blow is written in via the trimming register 12. Thereby, it is possible to check trimming effects in the same conditions as fuse blown state.

At this stage, if it is judged that expected effects are attained as planned by the trimming data Ft from the trimming register circuit 6, then a fuse may be blown first.

On the contrary, if it is judged that effects are insufficient or to excess, the trimming data Ft from the trimming register 6 may be adjusted and optimized, and on the basis of the value, a fuse may be blown.

Figure 11:
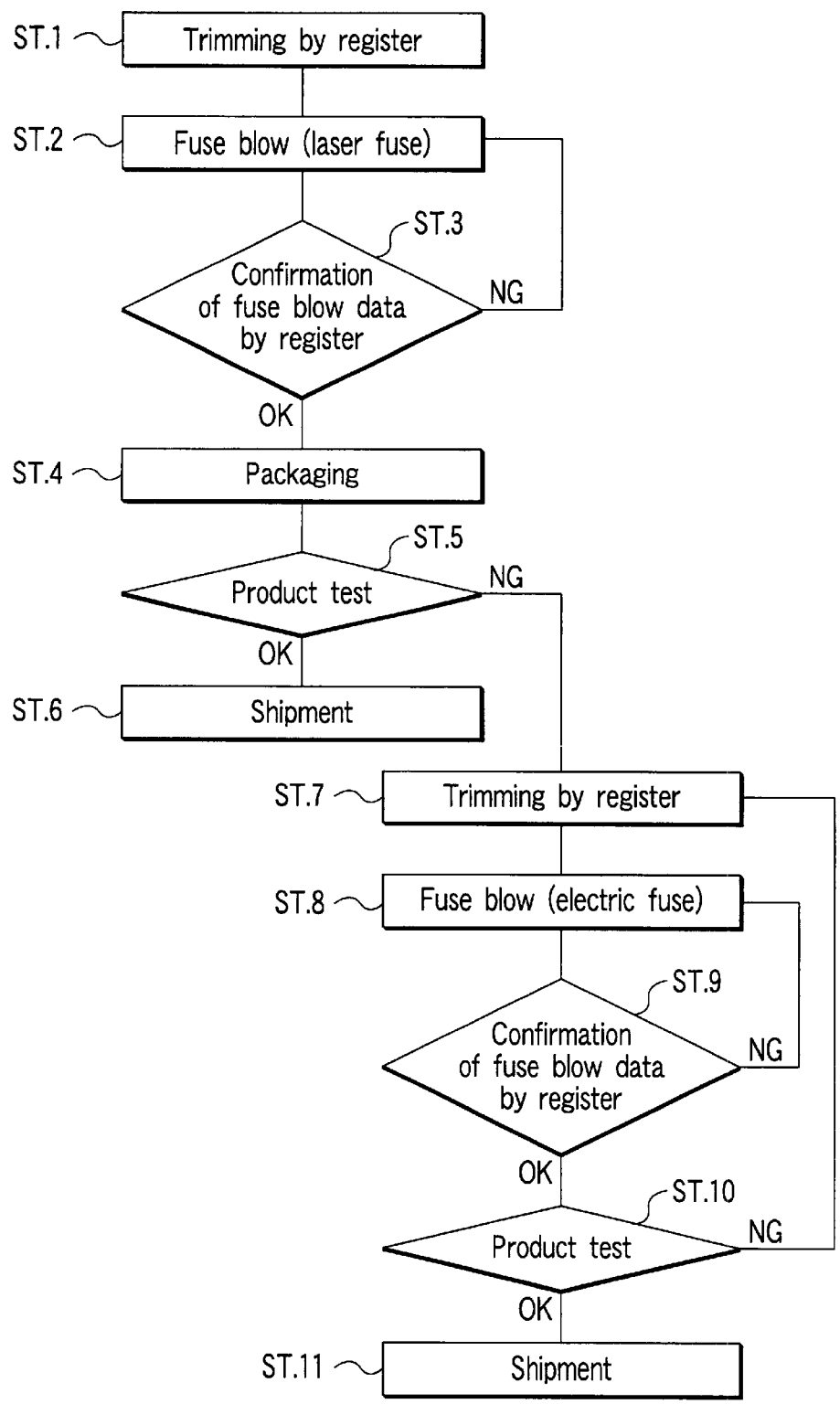
FIG. 11 is a flow chart showing an example of a trimming method using the semiconductor integrated circuit device according to the first embodiment of the present invention.

FIG. 11 shows a flow chart of trimming method in the present invention.

In the case of carrying out trimming by a laser fuse before a chip is packaged too, first, trimming is carried out on the basis of the data from the trimming register circuit 6, and a fuse blow value is determined (ST. 1).

Then, according to the above fuse blow value, a laser fuse is blown (ST. 2), and it is checked whether the fuse has been blown correctly or not by use of the trimming register (ST. 3).

If the fuse has not been blown (NG), then the procedures go back to fuse blow process, where the fuse is blown once again. If it is found that the fuse has been blown correctly (OK), then the chip is filled into the package (ST. 4).

Then, product test is carried out (ST. 5), and if there is no problem, products are shipped (ST. 6).

If trimming is required once again owing to influence of packaging (NG), then by use of the trimming register circuit 6, a fuse value of trimming by an electric fuse is determined (ST. 7).

In the next place, on the basis of the above fuse value, the electric fuse is blown (ST. 8), and it is checked whether the fuse has been blown correctly or not by use of the trimming register circuit 6 (ST. 9).

If the fuse has not blown (NG), then the procedures go back to fuse blow process, where the fuse is blown once again. If it is found that the fuse has been blown correctly (OK), product test is carried out (ST. 10), and if there is no problem, products are shipped (ST. 11).

If there is a problem, for example any nonconformity has been found (NG), by use of the trimming register circuit 6, a fuse value may be determined once again.

From the above, according to the present invention, it is possible to carry out trimming with the optimized value to all the chips, different from the prior art where it can be found that trimming effects are insufficient or to excess only after a fuse is blown.

Further, according to the present invention, it is possible to check whether a fuse has been blown correctly or not even after packaging in easy manners by use of the trimming register circuit 6, therefore, in the case of fuse blow by use of an electric fuse, the invention is also effective in verification of fuse blow.

By the trimming method shown in FIG. 11, it is possible to remedy a device where fuse blow has been incomplete, as a result, it is possible to increase yield further.

Second Embodiment

Figure 12A:
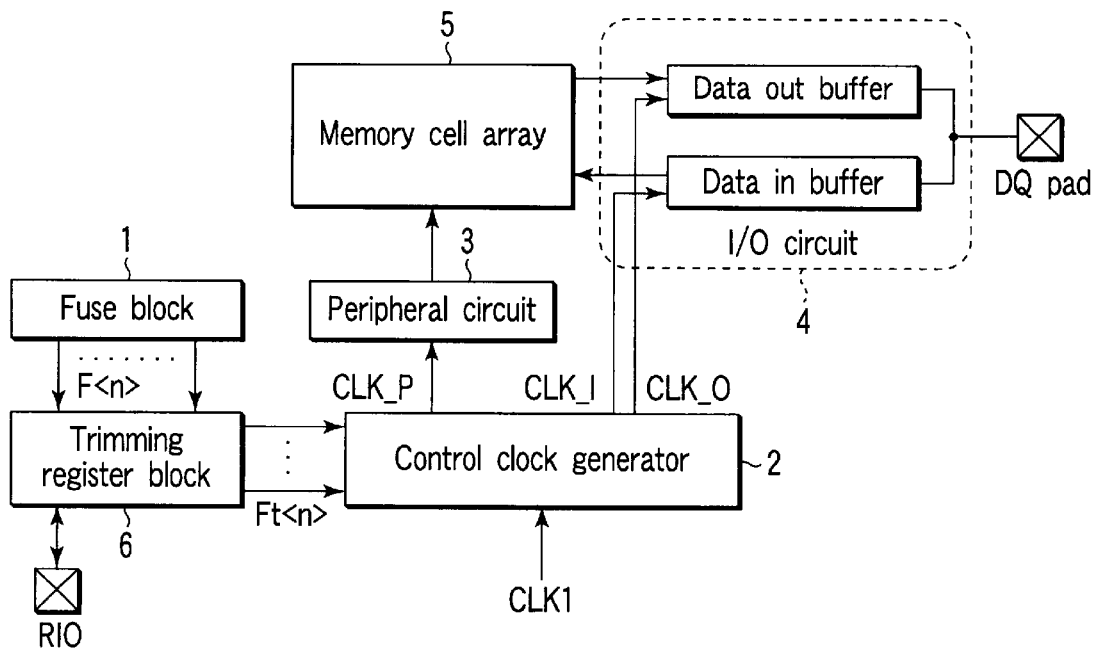
FIG. 12A is a block diagram showing a configuration example of a semiconductor integrated circuit device according to a second embodiment of the present invention.
Figure 12B:
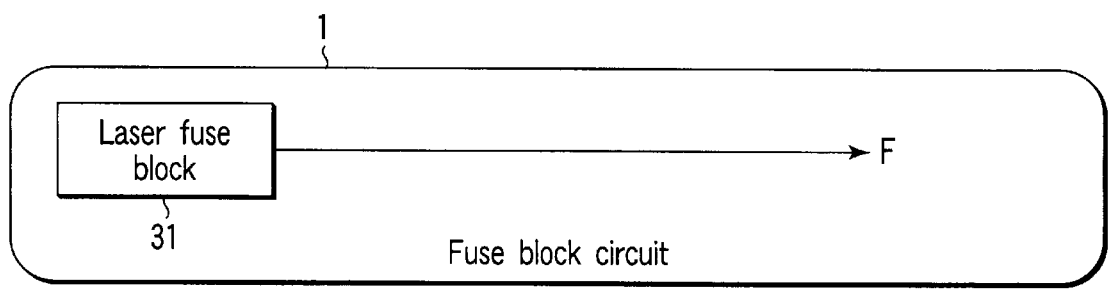
FIG. 12B is a diagram showing a configuration example of a fuse set block which the semiconductor integrated circuit device according to the second embodiment of the present invention.

FIG. 12A is a block diagram showing a constitution of a semiconductor integrated circuit device according to a second embodiment of the present invention. FIG. 12B is a diagram showing a constitution of a fuse set block thereof.

As shown in FIG. 12A, the semiconductor memory device according to the second embodiment, as well as the first embodiment, includes a fuse set block 1 having fuse data F<n> of the number n in total of fuses for circuit characteristic trimming, a clock generating circuit 2 that can trim the clock generation timing to the optimized value by the fuse data F<n>, a trimming register circuit 6 that creates a trimming data signal Ft<n> to control clock generating circuits, a peripheral circuit 3 controlled by the internal clock generated by the clock generating circuit 2, an I/O circuit 4 consisting of two circuits, i.e., a data output buffer (Data Out Buffer) and a data input buffer (Data In Buffer), and a memory cell array 5 whose data writing and reading are controlled by the two circuits controlled by the internal clocks.

However, in this second embodiment, as shown in FIG. 12B, different from the configuration of the fuse set block 1 in the first embodiment, the fuse comprises only a laser fuse 31.

In the semiconductor memory device according to the second embodiment of the present invention, in the same manner as in the first embodiment, by use of the trimming register circuit 6, it is possible to determine the most suitable fuse value by confirming fuse blow effects in advance, and it is possible to carry out trimming to all the chips with the most suitable value.

Third Embodiment

Figure 13A:
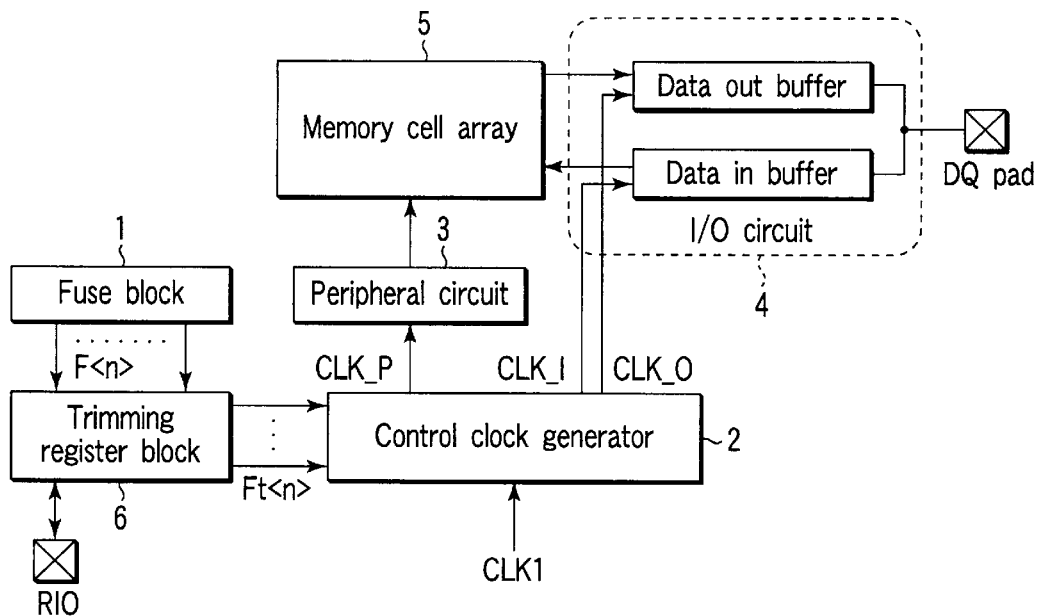
FIG. 13A is a block diagram showing a configuration example of a semiconductor integrated circuit device according to a third embodiment of the present invention.
Figure 13B:
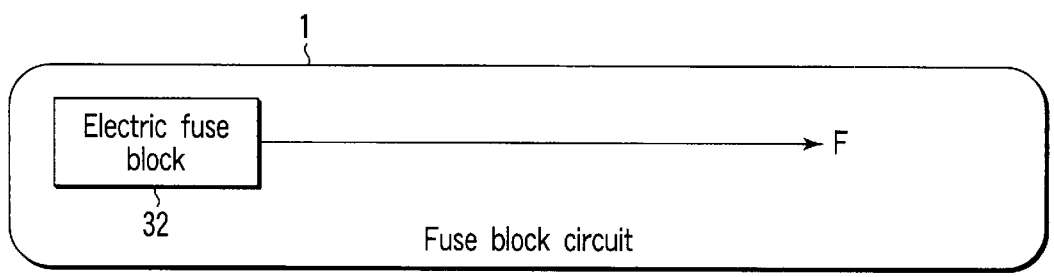
FIG. 13B is a diagram showing a configuration example of a fuse set block which the semiconductor integrated circuit device according to the third embodiment of the present invention has.

FIG. 13A is a block diagram showing a constitution of a semiconductor integrated circuit device according to a third embodiment of the present invention. FIG. 13B is a diagram showing a constitution of a fuse set block thereof.

As shown in FIG. 13A, the semiconductor memory device according to the second embodiment, as well as the first embodiment, includes a fuse set block 1 having fuse data F<n> of the number n in total of fuses for circuit characteristic trimming, a clock generating circuit 2 that can trim the clock generation timing to the optimized value by the fuse data F<n>, a trimming register circuit 6 that creates a trimming data signal Ft<n> to control clock generating circuits, a peripheral circuit 3 controlled by the internal clock generated by the clock generating circuit 2, an I/O circuit 4 consisting of two circuits, i.e., a data output buffer (Data Out Buffer) and a data input buffer (Data In Buffer), and a memory cell array 5 whose data writing and reading are controlled by the two circuits controlled by the internal clocks.

However, in this third embodiment, as shown in FIG. 13B, different from the configuration of the fuse set block in the first and second embodiments, the fuse comprises only an electric fuse 32.

In the semiconductor memory device according to the third embodiment of the present invention, in the same manners as in the first and second embodiments, by use of the trimming register circuit 6, it is possible to determine the most suitable fuse value by confirming fuse blow effects in advance, and it is possible to carry out trimming to all the chips with the most suitable value.

Fourth Embodiment

Figure 14:
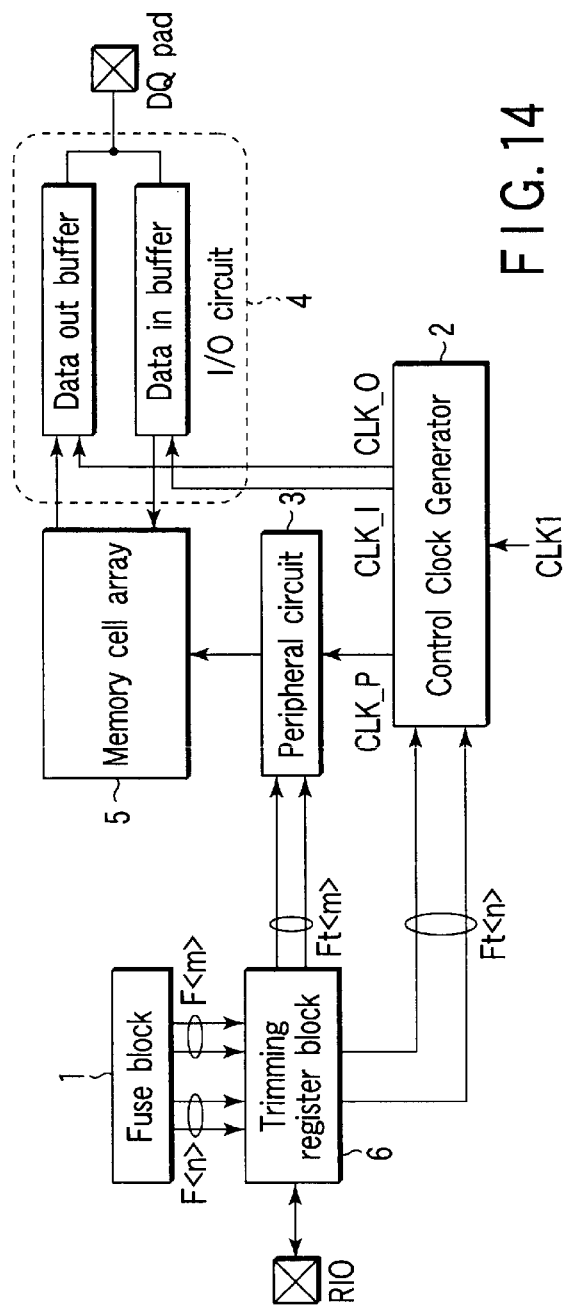
FIG. 14 is a block diagram showing a configuration example of a semiconductor integrated circuit device according to a fourth embodiment of the present invention.
Figure 15:
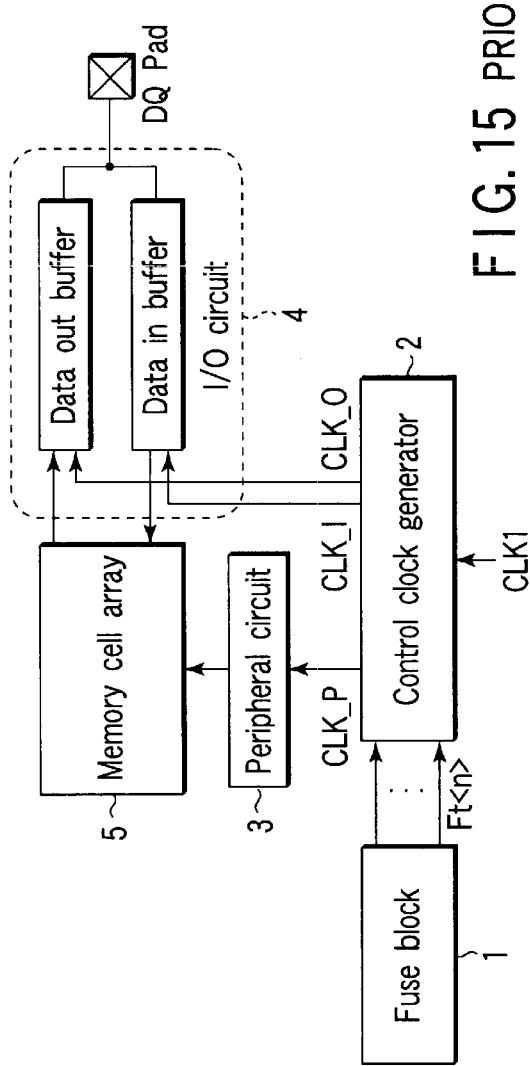
FIG. 15 is a block diagram showing a typical semiconductor integrated circuit device.
Figure 16A:
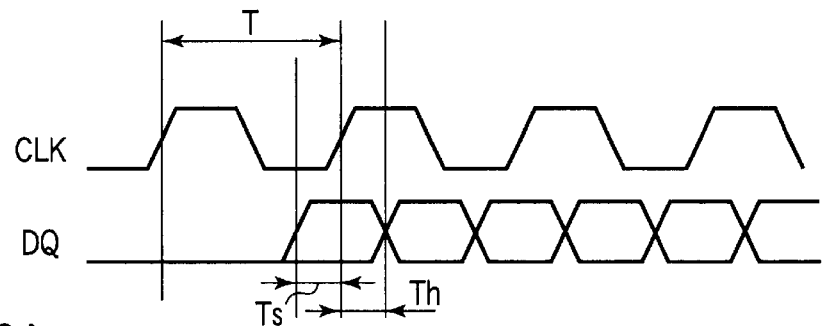
FIG. 16A is a diagram showing a relation between an external clock CLK and data DQ.
Figure 16B:
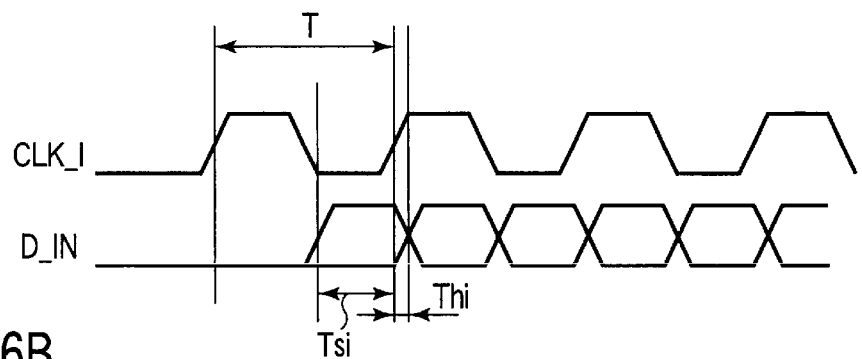
FIG. 16B is a diagram showing a relation between an internal clock CLK_I and input data D_IN (before trimming).
Figure 16C:
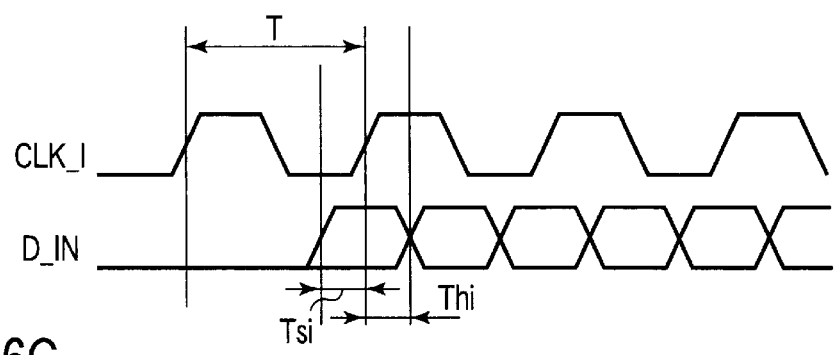
FIG. 16C is a diagram showing a relation between an internal clock CLK_I and input data D_IN (after trimming).

FIG. 14 is a block diagram showing a constitution of a semiconductor integrated circuit device according to a fourth embodiment of the present invention.

As shown in FIG. 14, the semiconductor memory device according to the fourth embodiment includes a fuse set block 1 comprising of the number n in total of fuses having fuse data F<n> for circuit characteristic trimming, and the number m in total of fuses for redundancy replacement of queue address having fuse data F<m>, a clock generating circuit 2 that can trim the clock generation timing to the optimized value by the fuse data F<n>, a trimming register circuit 6 that creates a trimming data signal Ft<n> to control the clock generating circuits 2, and a redundancy signal Fr<n> to control the redundancy replacement of queue address, a peripheral circuit 3 controlled by the internal clock generated by the clock generating circuit 2, and the redundancy signal Fr<m> output from the trimming register circuit 6, an I/O circuit 4 consisting of two circuits, i.e., a data output buffer (Data Out Buffer) and a data input buffer (Data In Buffer), and a memory cell array 5 whose data writing and reading are controlled by the two circuits controlled by the internal clocks.

In the semiconductor memory device according to the fourth embodiment of the present invention, in the same manners as in the first, second, and third embodiments, by use of the trimming register circuit 6, it is possible to determine the most suitable fuse value by confirming fuse blow effects in advance, and it is possible to carry out trimming to all the chips with the most suitable value.

Furthermore, in the fourth embodiment, in the case of redundancy replacement of queue address too, it is possible to carry out testing in the same conditions as the case where redundancy replacement has been carried out, by the use of the trimming register circuit, therefore, it is possible to conduct a precise redundancy replacement.

According to the present invention mentioned heretofore with the above first to fourth embodiments, when carrying out the trimming of chip internal timing by fuse blow and the redundancy replacement of queue address, before a fuse if blown actually, trimming of internal timing and redundancy replacement are carried out by use of the register circuit, and on the basis of the results thereof, a fuse value for actual fuse blow is determined.

By reading the conditions of fuse by use of the above register circuit, it is possible to precisely judge whether fuse blow is successful or not, and to grasp the redundancy replacement information per chip. By this method shown and described heretofore, it is realized to obtain a semiconductor memory device that enables to determine the most suitable fuse value to carry out timing trimming per chip, and to carry out precise redundancy replacement to queue address.

As described heretofore, the present invention has been explained in reference to the first to fourth embodiments thereof, however, the present invention may be embodied in other specific forms without departing from the spirit or essential characteristics thereof.

It may be well understood by those skilled in the art that the above respective embodiments may be embodied by single or by combination.

Further, each of the embodiments mentioned above includes various steps of invention, and by appropriate combinations of a plurality of structural components disclosed in each of the embodiments, it is possible to extract various stages of invention, which is apparent to those skilled in the art.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:

an integrated circuit portion;

a fuse element block including a programmable fuse element; and a data transfer selecting circuit that selects any one of transfer of data programmed in the fuse element to the integrated circuit portion, transfer of data input from outside to the integrated circuit portion, and transfer of data programmed in the fuse element to outside.

2. The device according to claim 1, wherein the integrated circuit portion is a control clock generating circuit, and the data is trimming data for trimming the timing of the control clock.

3. A semiconductor integrated circuit device comprising:

a fuse element block including a programmable fuse element; and a register that being able to store data input from outside, store data programmed in the fuse element, and output accumulated data to outside.

4. A semiconductor integrated circuit device comprising:

an integrated circuit portion;

a fuse element block including a programmable fuse element; and a register block including a register and a data transfer selecting circuit, the register being able to store data input from outside, store data programmed in the fuse element, and output accumulated data to outside, the data transfer selecting circuit to select any one of transfer of data programmed in the fuse element to the integrated circuit portion, transfer of data accumulated in the register to the integrated circuit portion, and transfer of data programmed in the fuse element to the register.

5. The device according to claim 4, wherein the integrated circuit portion is a control clock generating circuit, and the data is trimming data for trimming the timing of the control clock.

6. The device according to claim 4, wherein the register is a shift register.

7. The device according to claim 4, wherein the register enables data serial-parallel conversion, and parallel-serial conversion.

8. The device according to claim 7, wherein the register receives data input from the outside in serial manner, and the data transfer selecting circuit transfers data stored in the register to the integrated circuit portion in parallel manner.

9. The device according to claim 7, wherein the data transfer selecting circuit transfers data programmed in the fuse element to the register in parallel manner, and the register outputs stored data to outside.

* * * * *